United States Patent
Nakazawa

(10) Patent No.: US 8,416,461 B2
(45) Date of Patent: Apr. 9, 2013

(54) SPREAD SPECTRUM CLOCK GENERATOR, SPREAD SPECTRUM CLOCK GENERATING METHOD, AND CIRCUIT, IMAGE READING DEVICE AND IMAGE FORMING APPARATUS USING THE SPREAD SPECTRUM CLOCK GENERATOR

(75) Inventor: Masamoto Nakazawa, Kawasaki (JP)

(73) Assignee: Ricoh Company, Limited, Tokyo (JP)

( * ) Notice: Subject to any disclaimer, the term of this patent is extended or adjusted under 35 U.S.C. 154(b) by 508 days.

(21) Appl. No.: 12/796,107

(22) Filed: Jun. 8, 2010

(65) Prior Publication Data

US 2011/0026083 A1 Feb. 3, 2011

(30) Foreign Application Priority Data

Jul. 30, 2009 (JP) ................. 2009-178207

(51) Int. Cl.
*H04N 1/407* (2006.01)
*H04N 1/36* (2006.01)
*H03L 7/06* (2006.01)
*H04B 1/00* (2006.01)
*H03D 3/24* (2006.01)
*G06F 1/00* (2006.01)

(52) U.S. Cl.
USPC .......... 358/3.26; 358/412; 327/156; 375/130; 375/376; 713/500

(58) Field of Classification Search .................. 358/1.15, 358/483, 401, 475, 410, 412, 415, 418, 420; 327/156, 157, 158, 163, 144, 145, 148; 375/130, 375/152, 376, 374, 375, 362, 132; 713/500, 713/501, 502, 503
See application file for complete search history.

(56) References Cited

U.S. PATENT DOCUMENTS

| | | | | |
|---|---|---|---|---|
| 5,943,382 A | * | 8/1999 | Li et al. ........................ | 375/376 |
| 6,426,804 B1 | * | 7/2002 | Kanno et al. .................. | 358/445 |
| 7,437,590 B2 | * | 10/2008 | Decker et al. ................. | 713/500 |
| 7,443,215 B1 | * | 10/2008 | Sidiropoulos ................. | 327/156 |
| 7,446,578 B2 | * | 11/2008 | Huang ........................... | 327/156 |
| 7,881,419 B2 | * | 2/2011 | Shin .............................. | 375/376 |
| 7,911,247 B2 | * | 3/2011 | Xu et al. ....................... | 327/156 |
| 8,160,117 B1 | * | 4/2012 | Courcy ......................... | 375/130 |
| 2002/0145478 A1 | * | 10/2002 | Chang .............................. | 331/78 |
| 2003/0039330 A1 | * | 2/2003 | Castiglione et al. .......... | 375/376 |
| 2004/0047007 A1 | * | 3/2004 | Kanno .......................... | 358/474 |
| 2005/0013343 A1 | * | 1/2005 | Giunco et al. ................ | 375/130 |

(Continued)

FOREIGN PATENT DOCUMENTS

| | | |
|---|---|---|
| JP | 2007-295027 | 11/2007 |
| JP | 2008-22345 | 1/2008 |

*Primary Examiner* — Madelein A Nguyen
(74) *Attorney, Agent, or Firm* — Oblon, Spivak, McClelland, Maier & Neustadt, L.L.P.

(57) ABSTRACT

The spread spectrum clock generator (SSCG) includes a phase comparator detecting phase difference between input clock and feedback clock; a charge pump supplying current depending on the phase difference; a loop filter converting the current to smoothed voltage; a voltage controlled oscillator generating a spread spectrum clock signal depending on the smoothed voltage; and a modulation signal generator generating modulation signal having amplitude depending on a modulation width set value. The SSCG further includes a modulation width detector detecting modulation width of the spread spectrum clock signal while comparing the modulation width with a modulation width target value to update the modulation width set value to narrow difference between the detected modulation width and the modulation width target value, followed by feeding back the updated modulation width set value to the modulation signal generator.

9 Claims, 11 Drawing Sheets

U.S. PATENT DOCUMENTS

| | | | |
|---|---|---|---|
| 2006/0261870 A1* | 11/2006 | Hayashida | 327/158 |
| 2007/0216915 A1* | 9/2007 | Tsukahara | 358/1.9 |
| 2008/0106748 A1* | 5/2008 | Tsukahara et al. | 358/1.1 |
| 2008/0231333 A1* | 9/2008 | Huang | 327/157 |
| 2009/0083567 A1* | 3/2009 | Kim et al. | 713/501 |
| 2009/0086875 A1* | 4/2009 | Shao et al. | 375/376 |
| 2010/0027061 A1 | 2/2010 | Nakazawa | |
| 2010/0231979 A1* | 9/2010 | Nagase et al. | 358/3.26 |
| 2011/0156782 A1* | 6/2011 | Huang et al. | 327/159 |

\* cited by examiner

SPREAD SPECTRUM CLOCK GENERATOR, SPREAD SPECTRUM CLOCK GENERATING METHOD, AND CIRCUIT, IMAGE READING DEVICE AND IMAGE FORMING APPARATUS USING THE SPREAD SPECTRUM CLOCK GENERATOR

BACKGROUND OF THE INVENTION

1. Field of the Invention

The present invention relates to a spread spectrum clock generator. In addition, the present invention relates to a circuit including an integrated circuit including the spread spectrum clock generator. Further, the present invention relates to an image reading device and an image forming apparatus, which use the spread spectrum clock generator. Furthermore, the present invention relates to a spread spectrum clock generating method.

2. Discussion of the Background

Recently, there is a need for an image forming apparatus such as digital copiers, which can produce high quality images at a high speed. Therefore, a need exists for an image reading device (scanner), which can read images at a high dot density and a high speed, so that the scanner can be used for such an image forming apparatus. In attempting to fulfill such a need, the scanning density and reading speed of recent scanners increases more and more. With increase in scanning density and reading speed of scanners, an electromagnetic interference problem is caused. In attempting to prevent occurrence of the problem, spread spectrum clock generators (hereinafter referred to as SSCG) have been used recently.

As illustrated in FIG. 12, which illustrates change of frequency of a clock signal with time relative to the reference frequency, a SSCG has a function of periodically modulating the frequency of an input clock signal. In addition, as illustrated in FIG. 13, which illustrates change of noise when plotting frequency and electric field strength on the horizontal and vertical axes, respectively, it becomes possible to decrease the peak level of emission noise (S1 and S2) from S1P to S2P per a unit time before or after the spread spectrum due to the spread spectrum effect.

SSCGs which constitute a phase locked loop (PLL) and input modulated signals (mod_sig) to a voltage controlled oscillator (VCO) of the PLL to generate a spread spectrum clock signal (ss_ck) as illustrated in FIG. 14 are well known as conventional SSCGs. In this regard, the voltage controlled oscillator (VCO) is an oscillator generating a clock signal having a frequency depending on the input voltage, wherein the voltage-frequency characteristic (i.e., V-f characteristic) thereof is linear. In addition, the VCO sensitivity (i.e., VCO gain) is defined as change of frequency ($\Delta F$) caused when the voltage is changed in an amount of $\Delta V$.

Since the VCO gain also varies depending on the semiconductor manufacturing process conditions, operation temperature, supply voltage, etc., it is difficult for the above-mentioned SSCGs to control the frequency modulation width with high precision. In addition, since the variation in modulation width is the variation in emission noise reduction effect, the EMI problem is caused depending on the property of the VCO itself and/or the use environment.

FIG. 14 is a block diagram illustrating a background SSCG. Referring to FIG. 14, a SSCG 1 is constituted of a phase comparator (PC) 2, a charge pump (CP) 3, a loop filter (LF) 4, an adder 5, a voltage controlled oscillator (VCO) 6, a divider 7, and a modulation signal generator (MOD_GEN) 8.

The phase comparator (PC) 2 detects the phase difference between an input clock signal ref_sig and a feedback clock signal (fb_ck) and outputs a signal having a pulse width depending on the phase difference detected. The charge pump (CP) 3 supplies a charge/discharge current, which depends on the phase difference detected by the phase comparator 2, to the loop filter (LF) 4. The loop filter (LF) 4 converts the current supplied from the charge pump 3 to a DC voltage while removing high frequency components from the thus generated voltage. The voltage controlled oscillator (VCO) 6 generates a clock signal having a frequency depending on the DC voltage supplied from the loop filter 4. The output from the voltage controlled oscillator (VCO) 6 is fed back to the phase comparator (PC) 2, wherein controlling is performed such that the feedback clock signal (fb_ck) has the same frequency as that of the input clock signal (ref_ck).

In this regard, a modulation signal (mod_sig) for use in modulating frequency is generated in the modulation signal generator (MOD_GEN) 8. The thus generated modulation signal (mod_sig) is blended with the output from the loop filter (LF) 4 to be input to the voltage controlled oscillator (VCO) 6. The modulation signal (mod_sig) has such a temporal profile as illustrated in FIG. 12. By inputting the modulation signal (mod_sig) to the voltage controlled oscillator (VCO) 6, a modulated clock signal (hereinafter referred to as spread spectrum clock signal (ss_ck)) is generated. In FIG. 14, 1/N and 1/M denote dividers 9 and 7, respectively, which divide the input clock signal (ref_ck) and feedback signal (clock) (fb_ck), respectively, to generate a spread spectrum clock signal (ss_ck) having an arbitrary frequency represented by the following equation (1):

$$ss\_ck=ref\_ck*(M/N) \quad (1)$$

FIG. 15 is a block diagram illustrating the configuration of the modulation signal generator (MOD_GEN) 8. Referring to FIG. 15, the modulation signal generator (MOD_GEN) 8 is constituted of a memory (ROM) 8-1 and a digital to analog converter (DAC) 8-2. This is called a direct digital synthesizer (DDS). The ROM 8-1 stores table data (digital code) (code) representing the modulation signal profile (one cycle of a triangular wave, in this case). By sequentially reading out the data at the predetermined cycle of the modulation frequency (mod_freq), followed by conversion to a voltage using the DAC 8-2, a modulation signal (mod_sig) is generated. In addition, as illustrated in FIG. 15, an attenuator (ATT) 8-3 is connected with the output side of the DAC 8-2 to control the attenuation level so that the modulation width becomes a targeted modulation width (mod_wid_tgt). Since the modulation width is determined depending on the amplitude of the modulation signal (mod_sig), by adjusting the amplitude using the attenuator (ATT) 8-3, a spread spectrum clock signal (ss_sig) having a targeted modulation width (mod_wid_tgt) can be generated. In this regard, the modulation generator (MOD_GEN) 8 may be constituted of a charge/discharge circuit using a current source and a capacitor instead of the above-mentioned direct digital synthesizer (DDS).

FIG. 16 illustrates the input-output characteristic, i.e., voltage-frequency characteristic, of the voltage controlled oscillator (VCO). As mentioned above, the voltage controlled oscillator (VCO) 6 is an oscillator generating a clock signal having a frequency depending on the input voltage, wherein frequency linearly varies with voltage. Specifically, as illustrated in FIG. 16, when a voltage (V) is input, a clock having a frequency (f) is generated. In this regard, when voltage varies in an amount of $\Delta V$ (V±$\Delta V$), frequency varies in an amount of ±$\Delta f$(f±$\Delta f$). Namely, by inputting a triangular modulation signal whose voltage varies in a range of V±$\Delta V$, to the voltage controlled oscillator (VCO) 6, a spread spectrum clock signal (ss_ck), whose frequency varies in a range of f±Δf (i.e., varies with time like a triangular wave), can be generated.

Since the voltage controlled oscillator (VCO) 6 is constituted of a transistor, a bias voltage is generally applied thereto to optimize the operating point of the transistor. Therefore, an offset region is present in each of the lower voltage side and the higher voltage side of the voltage in the voltage-frequency characteristic illustrated in FIG. 16, and in general, the voltage controlled oscillator (VCO) 6 is used in an effective variable range in which frequency linearly varies with voltage.

However, the voltage-frequency characteristic of the voltage controlled oscillator (VCO) 6 varies depending on variables such as the semiconductor manufacturing process conditions, operation temperature and supply voltage. Therefore, the VCO sensitivity (i.e., VCO gain), which is defined as the voltage-frequency ratio (=Δf/ΔV, i.e., slope of the voltage-frequency characteristic curve), is largely influenced by such variables as mentioned above. When the same voltage V±ΔV is applied, the average frequencies of the VCO1 and VCO2 are the same according to the PLL principle. However, as illustrated in FIG. 17, even when the same voltage V±ΔV is applied, the VCO gains of the VCO1 and VCO2 are different from each other, and therefore the modulation widths thereof are different from each other (i.e., Δf1 ≠ Δf2). This means that the modulation width of the spread spectrum clock signal (ss_ck) obtained by a SSCG varies depending on the VCO gain, resulting in variation of the EMI reduction effect.

In attempting to address the problem, i.e., in attempting to control variation of VCO gain to enhance the modulation precision of the SSCG, a published unexamined Japanese patent application No. (hereinafter referred to as JP-A) 2007-295027 proposes a technique in that a PLL generating an unmodulated clock signal (PLL clock signal) and a synchronous control circuit generating a spread spectrum clock signal while synchronizing the spread spectrum clock signal with the PLL clock signal are provided to control variation of VCO gain.

When the average frequency and the modulation width are varied by the same cause and the amounts of the variations are the same, the variations can be reduced. However, when the average frequency and the modulation width are independently varied, the variation of the modulation width cannot be reduced although only the variation of the average frequency can be reduced. In this regard, if the modulation width is varied in the direction opposite to that of the average frequency, the variation of the modulation width is further worsened.

JP-A2008-022345 discloses a SSCG, which includes a divider configured to output a divided output signal; a phase comparator configured to detect the difference between the divided output signal and the reference clock signal received; a charge pump configured to generate a charge/discharge signal depending on the phase difference; a loop filter configured to generate a differential signal depending on the charge/discharge signal; a modulation circuit configured to generate a modulated wave when the differential signal and a modulating wave are input thereto; and a clock generator configured to generate a clock signal having a frequency depending on the modulated wave. The SSCG further includes a modulating wave generating circuit configured to generate a modulating wave according to the clock signal.

In this SSCG, the modulating wave generating circuit generates according to the clock signal and the modulating wave is added to the signal output from the loop filter to generate a spread spectrum clock signal. Therefore, variation of the modulating wave caused by variables such as variations of the matching process, power source and environmental temperature can be reduced. The present inventor considers that it is necessary for the SSCG to control the frequency modulation width with higher precision.

SUMMARY

This patent specification describes a novel spread spectrum clock generator (SSCG) which can control the frequency modulation width with high precision. One example thereof is a spread spectrum clock generator including a phase difference detector; a current supplying device; a smoothing device; a voltage controlled oscillator; a modulation signal generator; an adder; a divider; and a modulation width detector.

The phase difference detector (such as phase comparator) is configured to detect the phase difference between an input clock signal and a feedback clock signal. The current supplying device (such as charge pump) is configured to supply a current depending on the phase difference signal output from the phase difference detector. The smoothing device (such as loop filter) is configured to convert the current output from the current supplying device to a voltage while smoothing the voltage. The voltage controlled oscillator is configured to generate a spread spectrum clock signal having a frequency depending on the smoothed voltage. The modulation signal generator is configured to generate a modulation signal having an amplitude depending on a modulation width set value. The adder inputs a signal obtained by adding the modulation signal output from the modulation signal generator and the output from the smoothing device to the voltage controlled oscillator so that the voltage controlled oscillator generates the spread spectrum clock signal according to the input signal. The divider is configured to divide the spread spectrum clock signal output by the voltage controlled oscillator to feed back the signal to the phase difference detector as the feedback clock signal.

The modulation width detector is configured to detect the modulation width of the spread spectrum clock signal generated by the voltage controlled oscillator while comparing the detected modulation width with a predetermined modulation width target value to update the modulation width set value in such a manner that the difference between the detected modulation width and the modulation width target value is narrowed, followed by feeding back the updated modulation width set value to the modulation signal generator.

This patent specification further describes a novel sensor driving circuit. One example thereof includes the above-mentioned spread spectrum clock generator and a timing signal generator configured to generate a clock signal using the spread spectrum clock signal generated by the spread spectrum clock generator so that a sensor is operated by the clock signal.

This patent specification further describes a novel image reading device. One example thereof includes a light source configured to emit light toward an optical image; an optical device configured to form an optical image of the original image; an image sensor configured to receive the optical image from the optical device; an A/D convertor configured to convert analog data of the optical image to digital data thereof; and a timing signal generator configured to generate a timing signal, wherein the timing generator include the above-mentioned spread spectrum clock generator.

This patent specification further describes a novel image forming apparatus. One example thereof includes the above-mentioned image reading device configured to read an original image and produce digital image data; and a printing device configured to form a visual image on a recording medium according to the digital image data.

This patent specification further describes a novel method for generating a spread spectrum clock signal. One example thereof includes the following steps:

detecting phase difference between an input clock signal and a feedback clock signal while outputting a phase difference signal;

supplying a current depending on the phase difference signal;

converting the output current to a voltage while smoothing the voltage;

generating a spread spectrum clock signal having a frequency depending on the smoothed voltage;

generating a modulation signal having an amplitude depending on a modulation width set value;

detecting the modulation width of the spread spectrum clock signal having a frequency depending on the smoothed voltage;

comparing the detected modulation width with a predetermined modulation width target value to update the modulation width set value in such a manner that difference between the detected modulation width and the modulation width target value is narrowed;

feeding back the updated modulation width set value for generating the modulation signal;

adding the modulation signal generated depending on the updated modulation width set value and the smoothed voltage so that the spread spectrum clock signal is generated according to the added signal; and dividing the spread spectrum clock signal to feed back the signal as the feedback clock signal.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION OF THE INVENTION

There is the following correspondence in the following description.

(1) Input clock signal: ref_ck
(2) Feedback clock signal: fb_ck
(3) Phase difference detector: Phase comparator (PC) 2
(4) Voltage supplying device (voltage supplying means): Charge pump (CP) 3
(5) Smoothing device (smoothing means): Loop filter (LF) 4
(6) Voltage controlled oscillator (oscillating means): Voltage controlled oscillator (VCO) 6
(7) Modulation width set value: mod_wid_cal
(8) Modulation signal: mod_sig
(9) Modulation signal generator: Modulation signal generator MOD_GEN 8
(10) Spread spectrum clock generator: SSCG 1
(11) Spread spectrum clock signal: Modulated clock signal ss_ck
(12) Modulation width: Vmod
(13) Modulation width target value: mod_wid_tgt
(14) Modulation width detector (modulation width detecting means): Modulation width detector (MOD_DET) 10
(15) Peak frequency: Vpk
(16) Bottom frequency: Vbtm
(17) Average frequency: Vave
(18) Image reading device: Scanner 111
(19) Image forming apparatus: Image forming apparatus 100

The present invention will be explained in detail.

In the present invention, in order to prevent occurrence of the EMI problem, the frequency modulation width is controlled with high precision in a spread spectrum clock generator (SSCG). By using the SSCG, high dot-density and high speed image processing devices (such as image reading devices and image forming apparatus) can be provided.

The present invention will be explained by reference to drawings.

Figure 1:
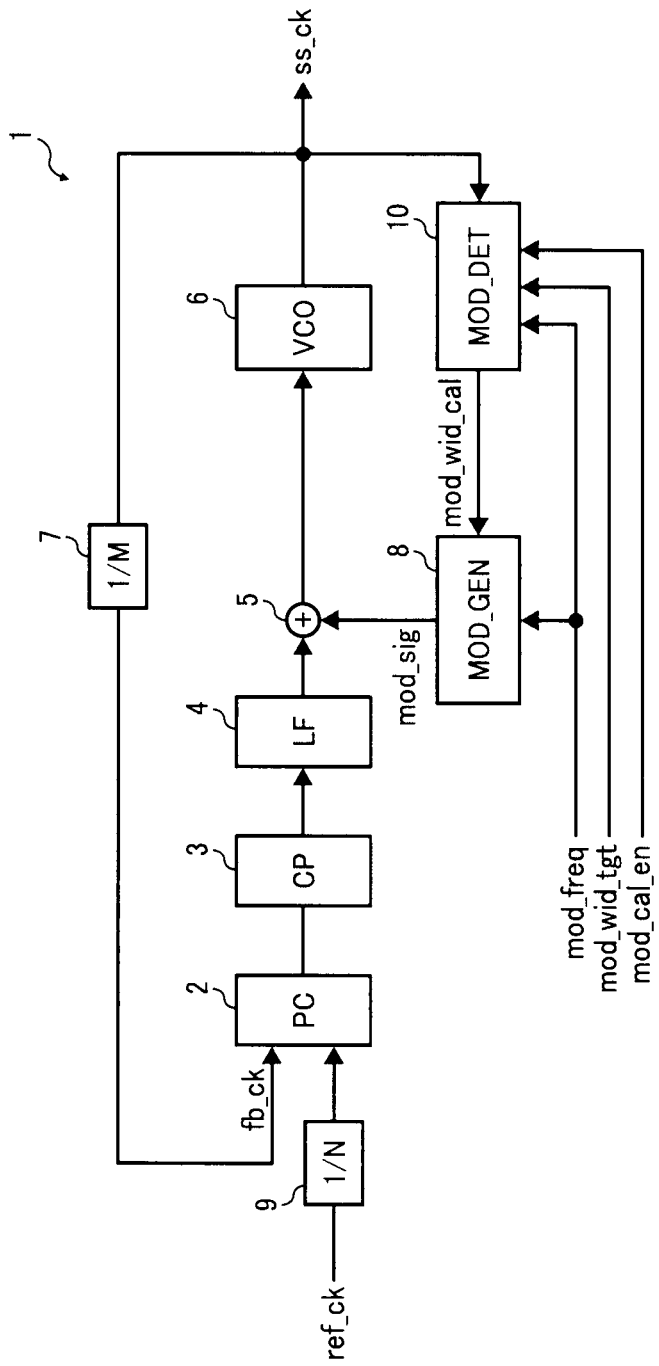
FIG. 1 is a block diagram illustrating an example of the spread spectrum clock generator (SSCG) of the present invention.

FIG. 1 is a block diagram illustrating the circuitry of an example of the spread spectrum clock generator (SSCG) of the present invention.

Figure 14:
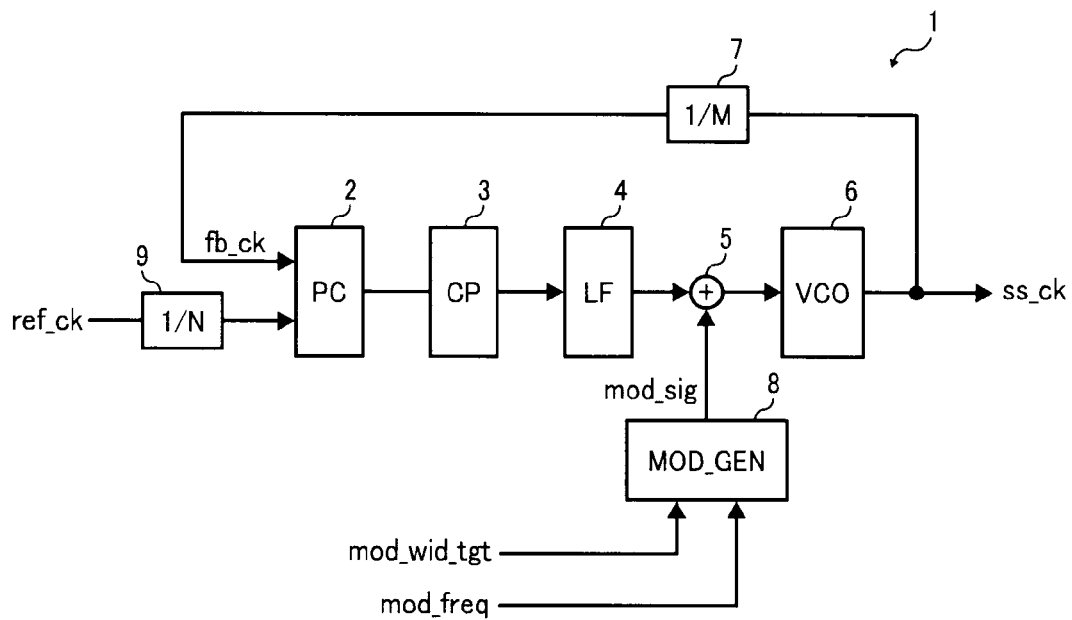
FIG. 14 is a block diagram illustrating a background spread spectrum clock generator (SSCG)

Referring to FIG. 1, a SSCG 1 of the present invention includes the phase comparator (PC) 2, charge pump (CP) 3, loop filter 4, adder 5, voltage controlled oscillator (VCO) 6, dividers 7 and 9, and modulation signal generator 8 similarly to the background SSCG illustrated in FIG. 14. In addition, the SSCG 1 further includes a modulation width detector (MOD_DET) 10, which is not included in the background SSCG illustrated in FIG. 14. The modulation width detector (MOD_DET) 10 directly detects the modulation width of the modulated clock signal (ss_ck) generated by the voltage controlled oscillator (VCO) 6, and performs controlling using the detection results such that the modulation width becomes a modulation width target value (mod_wid_tgt).

The modulation width of the modulated clock signal (ss_ck) is detected by the modulation width detector (MOD_DET) 10. In addition, the modulation width target value (mod_wid_tgt), which is input to the modulation signal generator (MOD_GEN) 8 in the background SSCG illustrated in FIG. 14, is input to the modulation width detector (MOD_DET) 10 in the SSCG 1 of the present invention as illustrated in FIG. 1. Further, as illustrated in FIG. 1, the preset modulation frequency (mod_freq) is input to both the modulation width detector (MOD_DET) 10 and modulation signal generator (MOD_GEN) 8. In addition, a modulation calibration updating signal (mod_cal_en) is input to the modulation signal generator (MOD_GEN) 8. The modulation width detector (MOD_DET) 10 generates an updated modulation width set value (mod_wid_cal), so that the updated modulation width set value approaches the modulation width target value (mod_wid_tgt).

Figure 2:
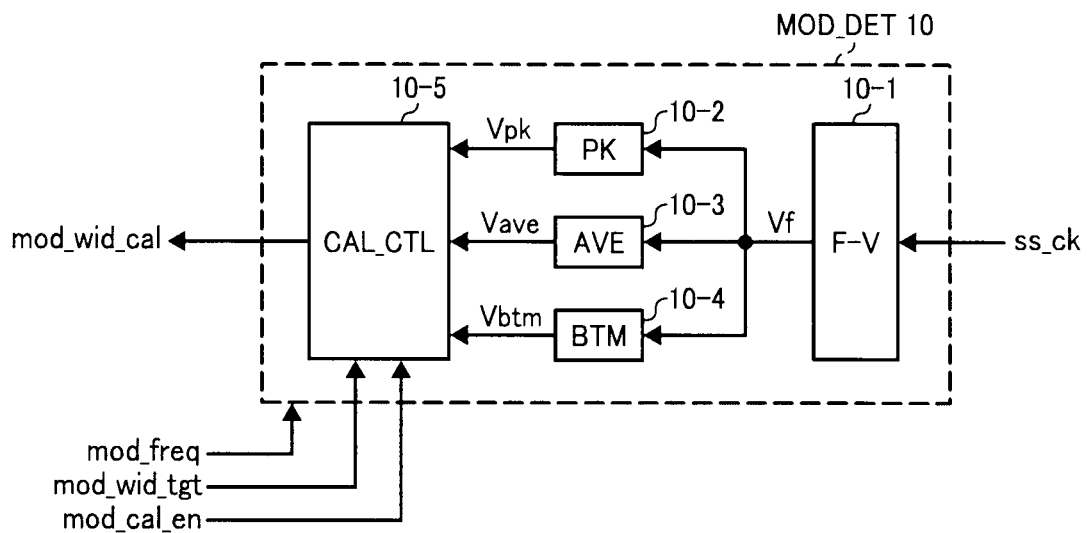
FIG. 2 is a block diagram illustrating the modulation width detector (MOD_DET) of the SSCG illustrated in FIG. 1.

FIG. 2 is a block diagram illustrating the modulation width detector (MOD_DET) 10. As illustrated in FIG. 2, the modulation width detector (MOD_DET) 10 includes a frequency-voltage converter (F-V) 10-1, a peak detector (PK) 10-2, an average detector (AVE) 10-3, a bottom detector (BTM) 10-4, and a calibration controller (CAL_CTL) 10-5.

Figure 3:
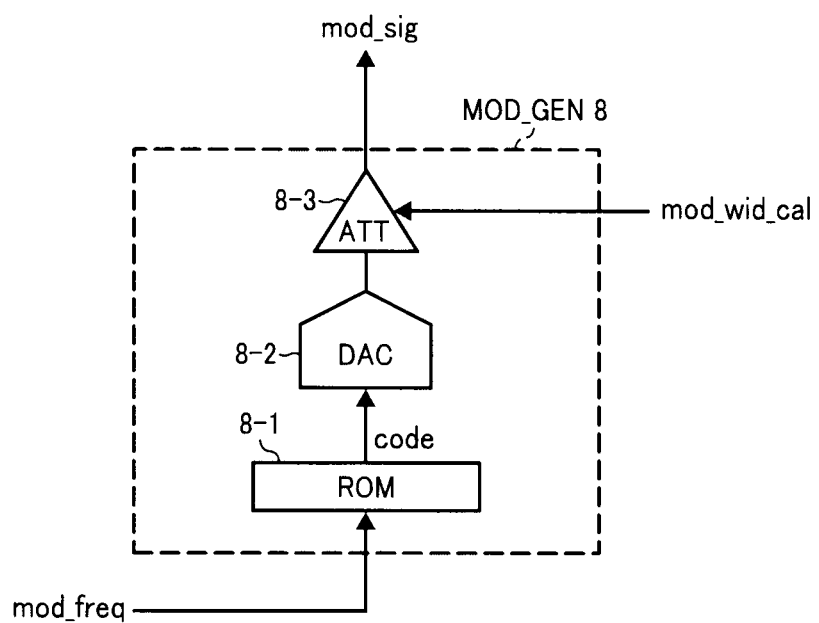
FIG. 3 is a block diagram illustrating the modulation signal generator (MOD_GEN) of the SSCG illustrated in FIG. 1.
Figure 15:
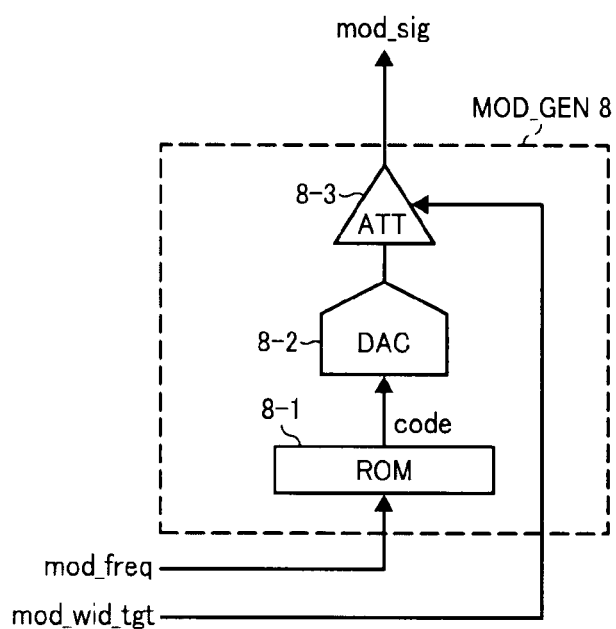
FIG. 15 is a block diagram illustrating the modulation signal generator (MOD_GEN) of the background SSCG illustrated in FIG. 14.
Figure 16:
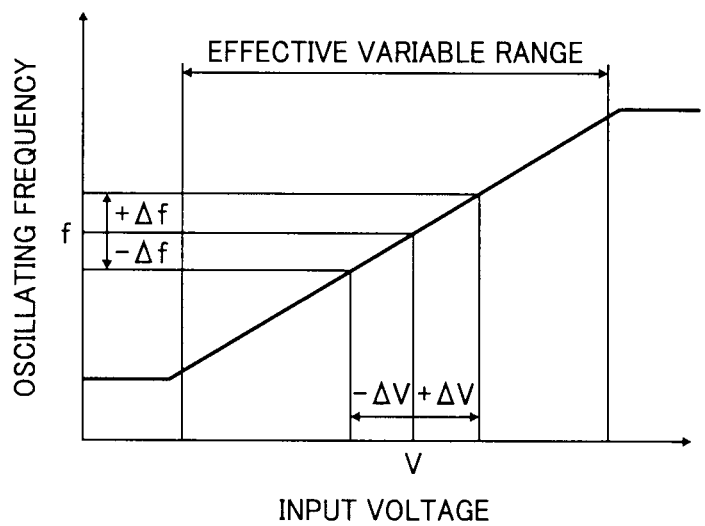
FIG. 16 is a graph illustrating the input-output characteristic (voltage-frequency characteristic) of the VCO of the background SSCG illustrated in FIG. 14.
Figure 17:
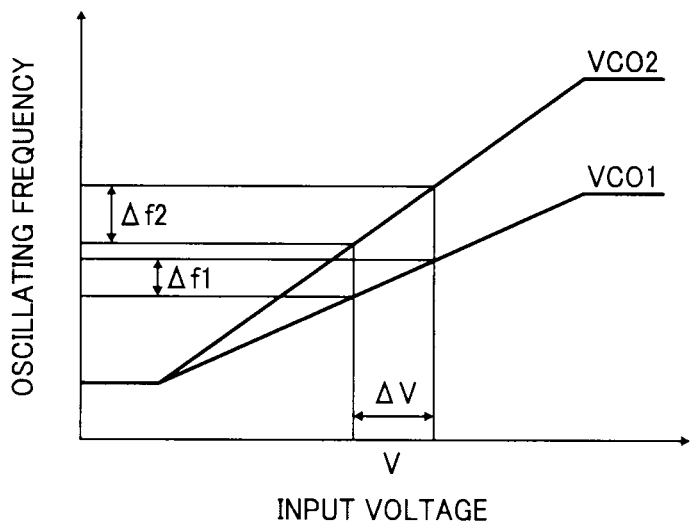
FIG. 17 is a graph illustrating a characteristic of a background SSCG such that when the VCOs 1 and 2 have different VCO gains, the modulation widths are different from each other.

FIG. 3 is a block diagram illustrating the modulation signal generator (MOD_GEN) 8. The modulation signal generator (MOD_GEN) 8 illustrated in FIG. 3 has the same structure as the modulation signal generator of the background SSCG illustrated in FIG. 15. However, the modulation signal generator (MOD_GEN) 8 is different from the background SSCG illustrated in FIG. 15 because the modulation width set value (mod_wid_cal) generated in the modulation width detector (MOD_DET) 10 is input to the attenuator (ATT) 8-3 instead of the modulation width target value (mod_wid_tgt).

In the SSCG 1 of the present invention illustrated in FIG. 1, the modulated clock signal (ss_ck) is input to the frequency-voltage converter (F-V) 10-1 of the modulation width detector (MOD_DET) 10 as illustrated in FIG. 2 to perform frequency-voltage (F-V) conversion (i.e., to convert frequency to voltage Vf).

Figure 4:
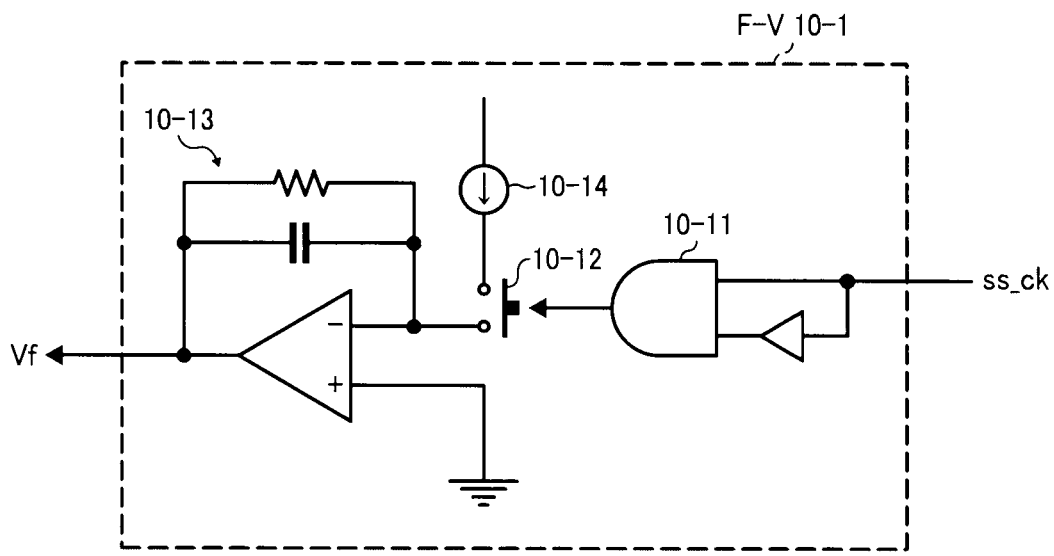
FIG. 4 is a block diagram illustrating the frequency-voltage converter (F-V) of the modulation width detector illustrated in FIG. 2.
Figure 5:
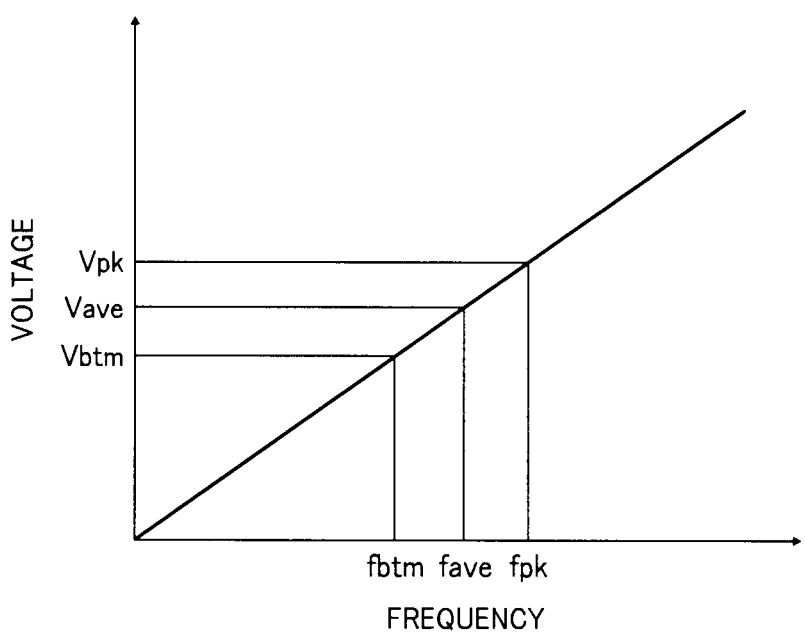
FIG. 5 is a graph illustrating the frequency-voltage characteristic of the frequency-voltage converter (F-V) illustrated in FIG. 4.
Figure 12:
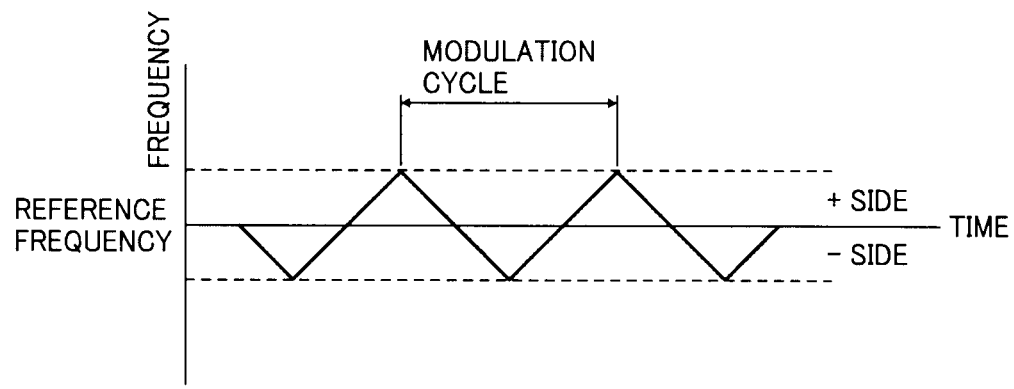
FIG. 12 is a graph illustrating temporal variation of a clock signal of a SSCG when the frequency is varied relative to the reference frequency.
Figure 13:
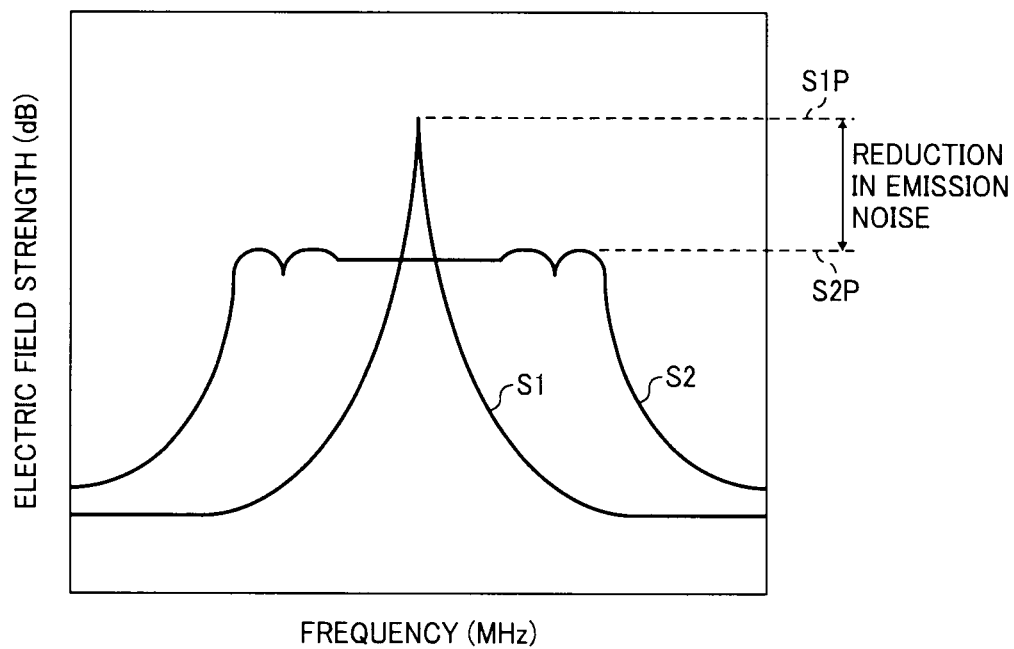
FIG. 13 illustrates change of noise of a SSCG in a graph in which frequency is plotted on the horizontal axis and electric field strength is plotted on the vertical axis.

FIG. 4 is a block diagram illustrating the frequency-voltage converter (F-V) 10-1. As illustrated in FIG. 4, the frequency-voltage converter (F-V) 10-1 performs an AND operation in an AND circuit 10-11 using the modulated clock signal (ss_ck) and a delayed signal of the modulated clock signal (ss_ck) to control a switch 10-12. The switch 10-12 is connected with an integrating circuit 10-13 and a current source 10-14. When the control signal from the AND circuit 10-11 is H, the switch 10-12 is turned on, thereby charging the capacitor of the integrating circuit 10-13. In this case, since the quantity of charge stored in the capacitor is proportional to the frequency, the frequency-voltage converter (F-V) 10-1 has such a linear frequency-voltage characteristic as illustrated in FIG. 5. Since the spread spectrum clock signal is a modulated clock signal, the voltage (Vf) after the frequency-voltage (F-V) conversion has such a temporal profile as illustrated in FIG. 12.

The peak detector (PK) 10-2, average detector (AVE) 10-3, and bottom detector (BTM) 10-4, respectively detect the peak value (Vpk), average value (Vave) and bottom value (Vbtm) of the output voltage (Vf) output from the frequency-voltage converter (F-V) 10-1, and inputs the data to the calibration controller (CAL_CTL) 10-5. In this regard, since the peak detection made by the peak detector (PK) 10-2 and the bottom detection made by the bottom detector (BTM) 10-4 are popular, they are not illustrated. For example, the peak detection and bottom detection can be easily made by using a peak hold circuit and a bottom hold circuit. In addition, an integrating circuit (LPF) can be used for the average detector (AVE) 10-3.

The calibration controller (CAL_CTL) 10-5 determines the modulation width from the peak value Vpk, Vave and Vbtm respectively determined by the peak detector 10-2, average detector 10-3 and bottom detector 10-4, and outputs the thus determined modulation width set value (mod_wid_cal), so that the modulation width set value approaches the modulation width target value (mod_wid_tgt).

Figure 6:
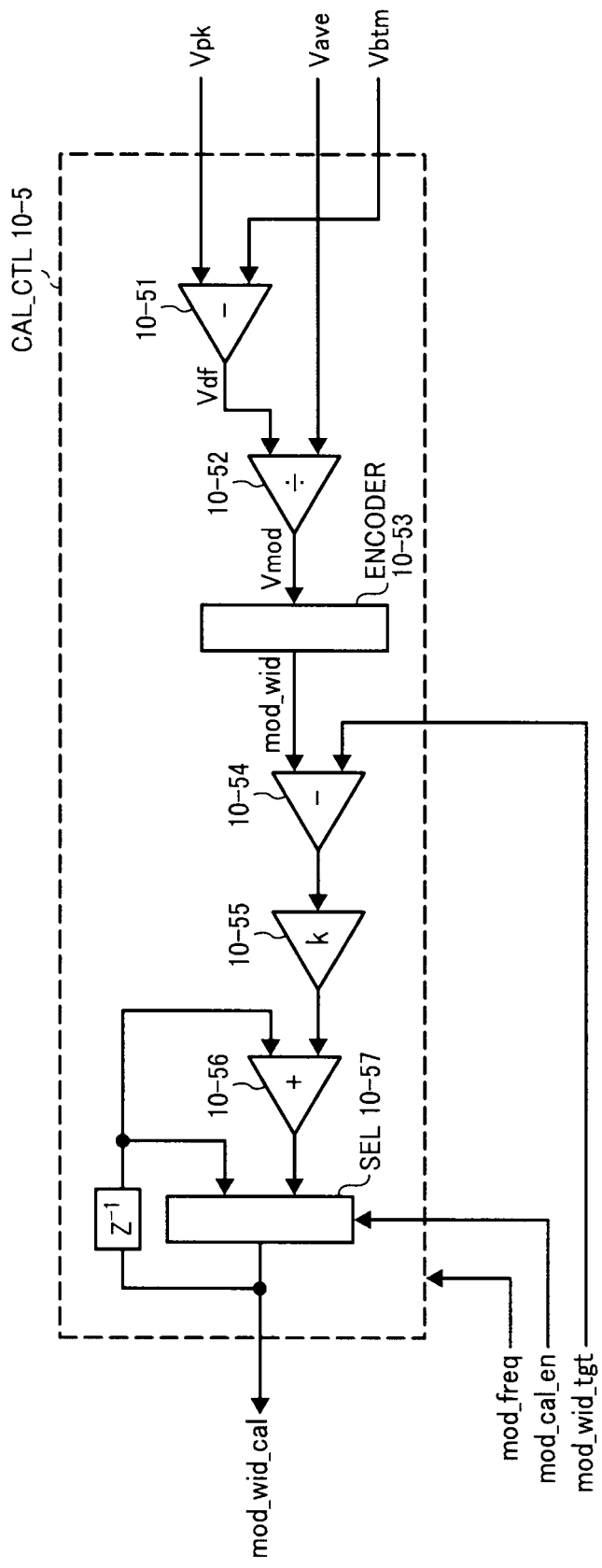
FIG. 6 is a block diagram illustrating a center-spread type calibration controller (CAL_CTL) for use in the modulation width detector illustrated in FIG. 2.
Figure 7:
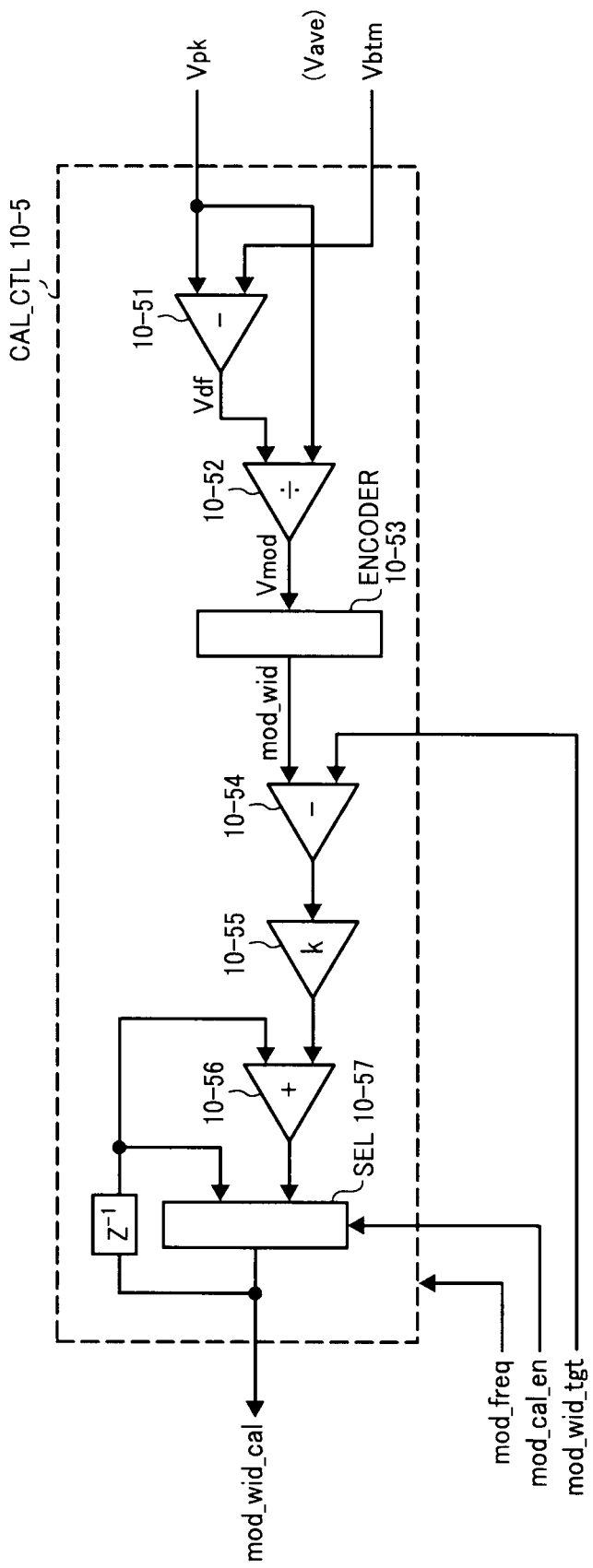
FIG. 7 is a block diagram illustrating a down-spread type calibration controller (CAL_CTL) for use in the modulation width detector illustrated in FIG. 2.
Figure 8:
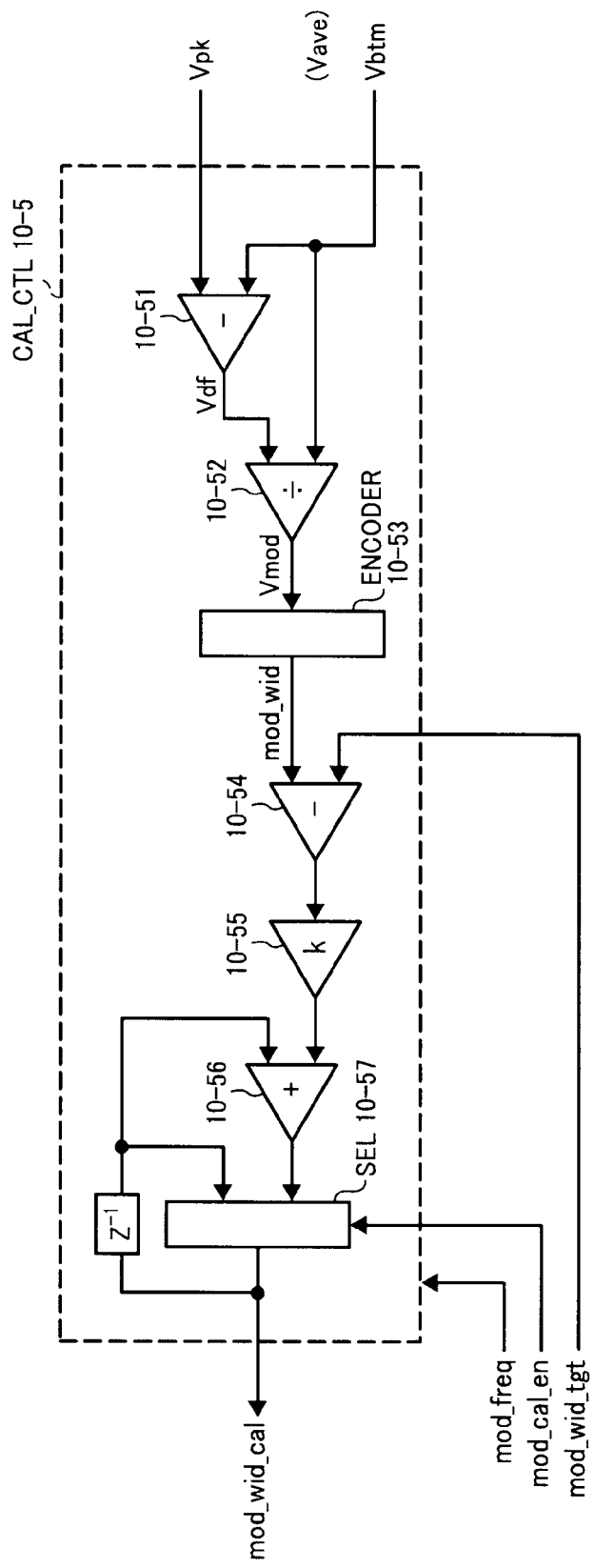
FIG. 8 is a block diagram illustrating an upper-spread type calibration controller (CAL_CTL) for use in the modulation width detector illustrated in FIG. 2.
Figure 9:
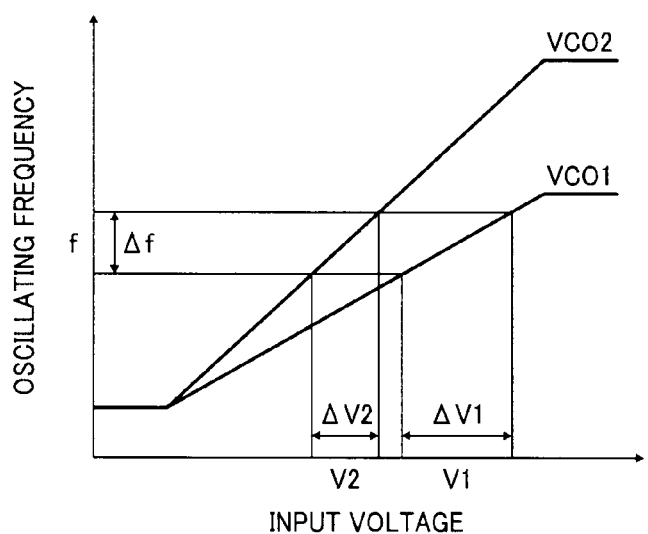
FIG. 9 is a graph for showing that it is possible to control the voltage input to VCO so as to have the predetermined frequency modulation width ($\Delta f$) even when the VCOs 1 and 2 have different VCO gains.

FIGS. 6-8 are block diagrams illustrating examples of the calibration controller (CAL_CTL) 10-5. FIG. 6 illustrates a center spread type calibration controller, which makes calibration of frequency on both the plus (+) and minus (−) sides of the targeted frequency. FIG. 7 illustrates a down spread type calibration controller, which makes calibration of frequency only on the minus (−) side of the targeted frequency. FIG. 8 illustrates an upper spread type calibration controller, which makes calibration of frequency only on the plus (+) side of the targeted frequency.

Hereinafter, a center spread type calibration controller, which is an example of the calibration controller (CAL_CTL) 10-5, will be explained.

In this example, the frequency difference (Vdf) is determined by a subtracter 10-51 on the basis of the detected peak value (Vpk) and bottom value (Vbtm), followed by dividing the frequency difference (Vdf)) by the average value (Vave) using a divider 10-52 to determine the modulation width (Vmod) as illustrated in FIG. 6. In this regard, the modulation width (Vmod) is represented by the following equation (2):

$$Vmod = Vdf/Vave = (Vpk - Vbtm)/Vave \ldots \quad (2).$$

In this regard, the value Vdf, which is the difference between the peak value (Vpk) and bottom value (Vbtm), corresponds to the frequency difference, and therefore it is possible to determine the modulation width only from this value. However, in this case, it is necessary to refer to table data including the relationship between frequency and voltage, and the preset frequency data. Namely, it is necessary to provide a memory or the like storing such information, thereby increasing the number of parts of the device, resulting in increase of the costs of the device.

In contrast, in this example, the frequency difference Vdf (=Vpk−Vbtm) is divided by the average value Vave. Therefore, the modulation width can be determined without referring to the above-mentioned information such as table data and preset frequency data. In addition, the above-mentioned equation (2) and the below-mentioned equations (3) and (4) are satisfied when the frequency-voltage (F-V) characteristic of the frequency-voltage (F-V) converter 10-1 is proportional as illustrated in FIG. 5. For example, even when the slope of the frequency-voltage (F-V) curve changes due to variation of the manufactured parts and variation of the actuating electric source and environmental temperature, and thereby the frequency difference Vdf (=Vpk−Vbtm) is varied, the modulation width is not varied because the frequency difference Vdf is divided by the average value (Vave) (i.e., the variation of the modulation width can be cancelled), namely, the modulation width can be determined without influenced by the variation of the frequency-voltage (F-V) characteristic, etc. Namely, by using this technique, the errors in detecting the modulation width can be eliminated in principle.

In a case of down spread type calibration controller, the following equation (3) is used instead of equation (2).

$$Vmod=Vdf/Vpk=(Vpk-Vbtm)/Vpk \ldots \quad (3)$$

Namely, the frequency difference (Vdf) is divided by the peak frequency (Vpk).

In a case of upper spread type calibration controller, the following equation (4) is used instead of equation (2).

$$Vmod=Vdf/Vbtm=(Vpk-Vbtm)/Vbtm \ldots \quad (4).$$

Namely, the frequency difference (Vdf) is divided by the bottom frequency (Vbtm).

As illustrated in FIGS. 7 and 8, it is not necessary for these down and upper spread type calibration controllers to detect the average frequency (Vave).

The thus determined modulation width (Vmod) is converted by an encoder (ENCODER) 10-53 to a value (mod_wid) having the same dimension (unit) as the modulation width target alue (mod_wid_tgt). After the difference between the value (mod_wid) and the modulation width target value (mod_wid_tgt) is determined by a subtracter 10-54, the difference is multiplied by a coefficient k by a coefficient multiplier 10-55, and the product is added to the last modulation width set value (mod_wid_cal) by an adder 10-56 to update the modulation width set value (mod_wid_cal). The thus updated modulation width set value (mod_wid_cal) is then output.

Namely, the relationship between the detected n-th modulation width mod_wid(n) and the modulation width set value mod_wid_cal(n) is represented by the following equation (5):

$$mod\_wid\_cal(n)=mod\_wid\_cal(n-1)+\{mod\_wid\_tgt-mod\_wid(n)\}*k \ldots \quad (5),$$

wherein n is a positive integer (1, 2, . . . .)

If equation (5) is rewritten on the n-th modulation width basis, the following equation (6) can be obtained:

$$mod\_wid(n)=mod\_wid\_tgt-\{mod\_wid\_cal(n)-mod\_wid\_cal(n-1)\}/k \ldots \quad (6).$$

This equation (6) represents the feedback controlling operation itself illustrated in FIG. 1.

When this calibration controlling operation is repeated (i.e., the repeat number (n) increases), the modulation width set value mod_wid_cal(n) converges on a certain value, which is not necessarily the modulation width target value (mod_wid_tgt), and controlling is made so that mod_wid_cal (n)−mod_wid_cal (n−1) becomes 0. Namely, the modulation width set value mod_wid_cal(n)becomes the modulation width target value (mod_wid_tgt). Thus, controlling is made so that the n-th modulation width set value becomes the modulation width target value.

The coefficient k in equations (5) and (6) is a following coefficient (0<k≦1). When the coefficient k is large, it is possible to quickly follow the modulation width target but the controlling operation is easily influenced by noises. In contrast, when the coefficient k is small, the controlling operation is not easily influenced by noises, but the speed in following the modulation width target is slow. Namely, by properly setting the coefficient k, the response in the controlling operation can be optimized.

In equations (5) and (6), the preset initial modulation width set value mod_wid_cal(0) is the modulation width target value (mod_wid_tgt).

Thus, a spread spectrum clock generator, which can control the frequency modulation width with high precision, can be provided. In addition, the frequency modulation width can be controlled with high precision because in the modulation width detector, the difference (Vf) between the peak frequency and the bottom frequency of the spread spectrum clock signal is divided by one of the average frequency (Vave), peak frequency (Vpk) and bottom frequency (Vbtm) to determine the modulation width.

In the modulation width controlling operation, it is general that the follow-up controlling converges, and thereby no problem is caused. However, there is a case where the follow-up controlling follows an unexpected noise, and thereby the modulation width is varied unexpectedly. In this case, the frequency of the operation clock varies discontinuously and there is concern that a noise is caused in the latter circuits.

Therefore, in this example, a selector (SEL) 10-57 is provided on the output side of the calibration controller 10-5 to stop updating of the modulation width set value (mod_wid_cal). The selector (SEL) 10-57 illustrated in FIG. 6 selects to output the currently updated modulation width set value (mod_wid_cal(n)) or the last modulation width set value (mod_wid_cal(n−1)) and makes controlling using a modulation calibration updating signal (mod_cal_en). In this regard, a character $Z^{-1}$ denotes delay in a synchronization clock, and represents that the modulation width set value (mod_wid_cal (n−1)) is output as the next modulation width set value (mod_wid_cal(n)).

Namely, when the modulation calibration updating signal (mod_cal_en) is H, the current modulation width set value (mod_wid_cal(n)) is output to the modulation width detector (MOD_DET) 10 to update the modulation width set value (mod_wid_cal). In contrast, when the modulation calibration updating signal (mod_cal_en) is L, the last modulation width set value (mod_wid_cal(n−1)) is maintained and stops updating of the modulation width set value. By using this technique, the modulation width set value is updated to stabilize the modulation width, for example, when the scanner is in awaiting state. When the scanner is in an operating state, the updating operation is stopped to prevent occurrence of a problem in that read image data are superimposed with a noise, thereby reducing the influence of a noise caused when the modulation width is changed.

In this example, explanation is made by reference to a scanner. However, this technique is not limited thereto, and can be applied to all the devices equipped with the SSCG of the present invention, such as printers having awaiting state and a printing state, facsimiles having a waiting state and a data sending/receiving state, communicating devices having a waiting state and a communicating state, and medical devices having a waiting state and an examining state.

In addition, in order to securely detect the peak, average and bottom frequencies in the modulation width detector (MOD_DET) 10, it is necessary to take an operation time longer than one cycle of the modulation frequency (mod_freq). This is because if the operation time is not longer than one cycle of the modulation frequency, it is likely that the peak frequency or bottom frequency cannot be detected. Therefore, the modulation cycle is input to the calibration controller 10-5 illustrated in FIGS. 6-8 so that the operation is made while synchronized with the modulation cycle. In this regard, it is possible that the operation period is not fixed and is changed while determined depending on the modulation cycle (such as period twice the modulation cycle). Similarly, the operation of the encoder (ENCODER) 10-53 is synchronized with the modulation cycle.

The modulation signal generator (MOD_GEN) 8 and modulation width detector (MOD_DET) 10 operate on the basis of the input clock signal (ref_ck) or un-modulated clock signal generated in a separately provided phase locked loop (PLL).

As mentioned above, in this example, since the input voltage to the VCOs (VCO1 and VCO2) having different VCO gains is controlled so that the modulation width becomes the predetermined frequency modulation width ($\Delta f$), the modulation width can be controlled with high precision without being influenced by variation of the parts of the SSCG1 (such as variation in the semiconductor manufacturing process) and variation of the operation temperature and supply voltage.

It is possible to provide a timing generator having a high precision modulation characteristic by using an integrated circuit (such as ASIC) including the SSCG1 of the present invention therefor.

Figure 10:
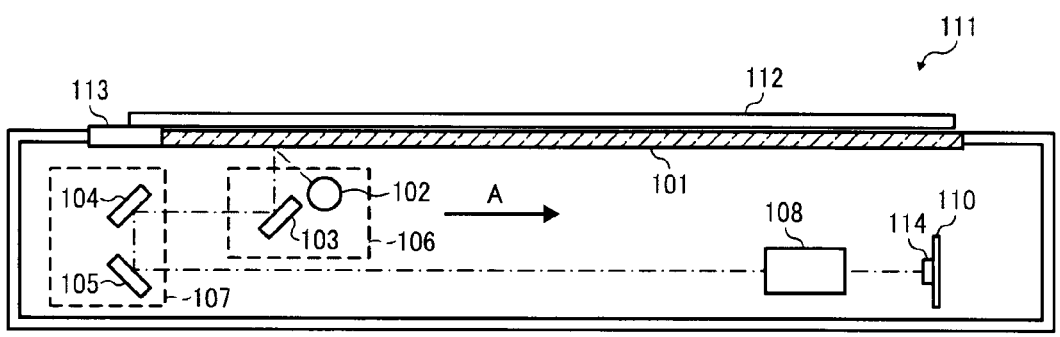
FIG. 10 is a schematic view illustrating an example of the image reading device of the present invention.

FIG. 10 is a schematic view illustrating an image reading device (scanner) of the present invention equipped with a timing signal generator to which the SSCG1 of the present invention is applied.

Referring to FIG. 10, a scanner 111 is a flat bed type scanner, and has a glass table 101 on which an original document is to be set on the upper portion thereof. A first carriage 106 and a second carriage 107, which move in a direction (i.e., sub-scanning direction) indicated by an arrow A in a speed ratio of 2/1, are arranged below the glass table 101. The first carriage 106 includes a halogen lamp 102 serving as a light source, and a first mirror 103, and the second carriage 107 includes a second mirror 104, and a third mirror 105. Light emitted by the halogen lamp 102 and reflected from the original document is reflected off the first, second and third mirrors 103, 104 and 105, followed by entering into a focusing lens 108 to be focused on the focusing surface of a CCD 114 (i.e., a linear image sensor). The first and second carriages 106 and 107, and the focusing lens 108 serve as an optical device. Light focused on the surface of the CCD 114 is subjected to photoelectric conversion to produce an analog electric signal, followed by conversion to a digital electric signal in a sensor board 110 to be sent to the next device.

The first and second carriages 106 and 107 move in the sub-scanning direction in a speed ratio of 2/1 so that the light path of from the surface of the original document to the image focusing surface of the CCD 114 remains constant. The CCD 114 is provided on the sensor board 110.

An openable/closable pressure plate 112 is provided on the glass table 101 to prevent occurrence of a problem in that when an original document is set on the glass table 101, light from the outside enters into the CCD 114. In this regard, it is possible that the pressure plate 112 is replaced with an ADF or ARDF to automatically feed an original document to the glass table 101. In addition, it is preferable to provide a reference white plate 113 on the home position side of the first and second carriages 106 and 107 so as to be used for shading correction.

Next, the image forming apparatus of the present invention will be explained.

Figure 11:
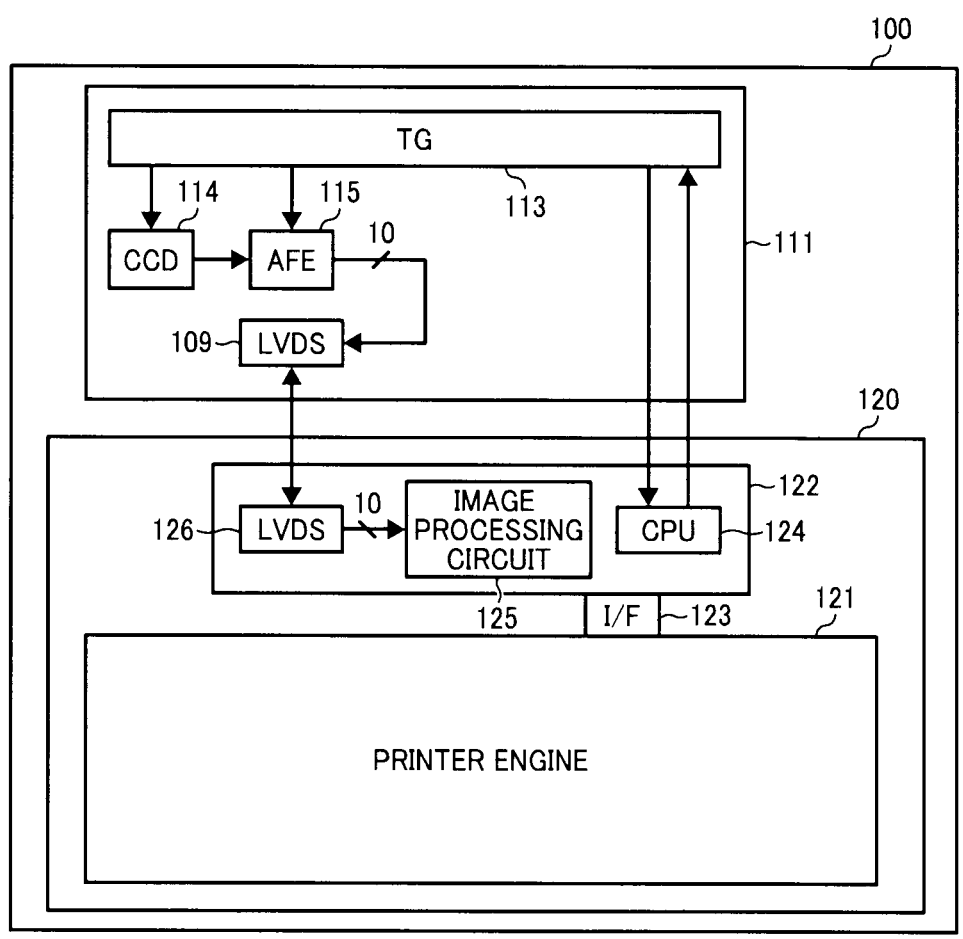
FIG. 11 is a schematic view illustrating an example of the image forming apparatus of the present invention including the image reading device illustrated in FIG. 10.

FIG. 11 is a schematic view illustrating an example of the image forming apparatus of the present invention equipped with the scanner illustrated in FIG. 10.

Referring to FIG. 11, an image forming apparatus 100 includes the scanner 111 and a printing device 120. The scanner 111 includes a timing signal generator (TG) 113, the CCD 114, and an analog front end (AFE) 115. A 10-bit DOUT signal is sent from the AFE 115 to a low voltage differential signaling (LVDS) 109.

The printing device 120 includes a printer engine 121, and a controller (printer controller) 122 configured to control the printer engine 121. The printer engine 121 and the controller 122 are connected with an interface (I/F) 123. The controller 122 includes a CPU 124, an image processer 125, and a LVDS 126. The CPU 124 is communicably connected with the TG 113. The controller 122 controls the printer engine 121 according to the image signals input to the controller through the LVDS 126 to form an image on a recording material such as paper sheets. Any known image forming processes can be used for the printer engine 121, and therefore detailed explanation of the printer engine 121 is omitted from this specification.

The image forming apparatus equipped with the scanner 111 and printing device 120 can be applied to digital multi function peripherals (MFP) having two or more of copier, printer, and facsimile functions as well as copiers and mono-functional printers. These apparatus can be connected through a network, and can produce images according to instruction from a network terminal. In addition, the image forming apparatus can be used for information processing apparatus such as facsimiles.

The CPU 124 reads out program stored in a ROM (not shown) to develop the program in a RAM (not shown) and to execute the program by using the RAM and a work area, thereby controlling the printer engine 121 so as to perform processes needed for image formation. The program is written in a recording medium such as FDs, CDs and DVDs. The program can be used by loading the software from the recording medium, or by downloading the program through a network.

Thus, by applying the SSCG1 of the present invention to image reading devices and image forming apparatus, the frequency modulation width can be controlled with high precision, and chance of occurrence of the electromagnetic interference (EMI) can be stably reduced.

In the above-mentioned image reading device and image forming apparatus of the present invention, when the modulation calibration updating signal (mod_cal_en) is H, the current modulation width set value (mod_wid_cal (n)) is output to the modulation width detector (MOD_DET) 10 to update the modulation width set value (mod_wid_cal). In contrast, when the modulation calibration updating signal (mod_cal_en) is L, the last modulation width set value (mod_wid_cal (n−1)) is maintained and stops updating of the modulation width set value. By using this technique, the modulation width set value is updated to stabilize the modulation width, for example, in a case where the scanner is in a waiting state. In a case where the scanner is in an operating state, the updating operation is stopped to prevent occurrence of a problem in that read image data are superimposed with a noise, thereby reducing the influence of a noise caused when the modulation width is changed. In addition, the image forming apparatus can produce images without being influenced by noises.

As mentioned above, according to the present invention, the modulation width of a spread spectrum clock signal generated by a variable oscillator is detected. The detected modulation width is compared with a modulation width target value to update the modulation width set value in such a manner that the difference between the detected modulation width and the modulation width target value is narrowed. The updated modulation width set value is fed back to a modulation signal generator so that the modulation signal output from the modulation signal generator is added to the output from a smoothing device. Therefore, the frequency modulation width can be controlled with high precision.

This document claims priority and contains subject matter related to Japanese Patent Application No. 2009-178207, filed on Jul. 30, 2009, incorporated herein by reference.

Having now fully described the invention, it will be apparent to one of ordinary skill in the art that many changes and modifications can be made thereto without departing from the spirit and scope of the invention as set forth therein.

What is claimed as new and desired to be secured by Letters Patent of the United States is:

1. A spread spectrum clock generator comprising:
   a phase difference detector configured to detect phase difference between an input clock signal and a feedback clock signal while outputting a phase difference signal;
   a current supplying device configured to supply a current depending on the phase difference signal output from the phase difference detector;
   a smoothing device configured to convert the current output from the current supplying device to a voltage while smoothing the voltage;
   a voltage controlled oscillator configured to generate a spread spectrum clock signal having a frequency depending on the smoothed voltage;
   a modulation signal generator configured to generate a modulation signal having an amplitude depending on a modulation width set value;
   an adder configured to input a signal obtained by adding the modulation signal generated by the modulation signal generator and the smoothed voltage output from the smoothing device to the voltage controlled oscillator so that the voltage controlled oscillator generates the spread spectrum clock signal according to the input signal;
   a divider configured to divide the spread spectrum clock signal output by the voltage controlled oscillator to feed back the signal to the phase difference detector as the feedback clock signal; and
   a modulation width detector configured to detect a modulation width of the spread spectrum clock signal generated by the voltage controlled oscillator while comparing the detected modulation width with a predetermined modulation width target value to update the modulation width set value in such a manner that difference between the detected modulation width and the modulation width target value is narrowed, followed by feeding back the updated modulation width set value to the modulation signal generator.

2. The spread spectrum clock generator according to claim 1, wherein the modulation width detector detects the modulation width on the basis of a quotient obtained by dividing difference between a peak frequency and a bottom frequency of the spread spectrum clock signal by one of the peak frequency, the bottom frequency and an average frequency thereof.

3. The spread spectrum clock generator according to claim 1, wherein the spread spectrum clock generator has a first mode in which the modulation width feedback is always performed and a second mode in which the modulation width feedback is stopped while maintaining the last modulation width set value.

4. The spread spectrum clock generator according to claim 3, wherein in a waiting state of the spread spectrum clock generator, the spread spectrum clock generator is set to the first mode, and in an operating state, the spread spectrum clock generator is set to the second mode.

5. A sensor driving circuit comprising:
   the spread spectrum clock generator according to claim 1; and
   a timing signal generator configured to generate a clock signal using the spread spectrum clock signal generated by the spread spectrum clock generator so that a sensor is operated by the clock signal.

6. An image reading device comprising:
   a light source configured to emit light toward an original image;
   an optical device configured to form an optical image of the original image;
   an image sensor configured to receive the optical image from the optical device;
   an A/D convertor configured to convert analog data of the optical image to digital image data; and
   a timing signal generator configured to generate a timing signal, wherein the timing signal generator includes the spread spectrum clock generator according to claim 1.

7. An image forming apparatus comprising:
   the image reading device according to claim 6 configured to read an original image to produce digital image data; and
   a printing device configured to form a visual image on a recording medium according to the digital image data.

8. A method for generating a spread spectrum clock signal, comprising:
   detecting phase difference between an input clock signal and a feedback clock signal while outputting a phase difference signal;
   supplying a current depending on the phase difference signal;
   converting the output current to a voltage while smoothing the voltage;
   generating a spread spectrum clock signal having a frequency depending on the smoothed voltage;
   generating a modulation signal having an amplitude depending on a modulation width set value;
   detecting the modulation width of the spread spectrum clock signal having a frequency depending on the smoothed voltage;
   comparing the detected modulation width with a predetermined modulation width target value to update the modulation width set value in such a manner that difference between the detected modulation width and the modulation width target value is narrowed;
   feeding back the updated modulation width set value for generating the modulation signal;
   adding the modulation signal generated depending on the updated modulation width set value and the smoothed voltage so that the spread spectrum clock signal is generated according to the added signal; and
   dividing the spread spectrum clock signal to feed back the signal as the feedback clock signal.

9. A spread spectrum clock generator comprising:
   means for detecting phase difference between an input clock signal and a feedback clock signal while outputting a phase difference signal;
   means for supplying a current depending on the phase difference signal output from the phase difference detecting means;
   means for converting the current output from the current supplying means to a voltage while smoothing the voltage;

oscillating means for generating a spread spectrum clock signal having a frequency depending on the smoothed voltage;

means for generating a modulation signal having an amplitude depending on a modulation width set value;

means for inputting a signal obtained by adding the modulation signal generated by the modulation signal generating means and the smoothed voltage output from the current converting means to the oscillating means so that the oscillating means generates the spread spectrum clock signal according to the input signal;

means for dividing the spread spectrum clock signal output by the oscillating means to feed back the signal to the detecting means as the feedback clock signal; and means for detecting a modulation width of the spread spectrum clock signal generated by the oscillating means while comparing the detected modulation width with a predetermined modulation width target value to update the modulation width set value in such a manner that difference between the detected modulation width and the modulation width target value is narrowed, followed by feeding back the updated modulation width set value to the modulation signal generating means.

* * * * *